US007961585B2

(12) United States Patent
Yoshikawa et al.

(10) Patent No.: US 7,961,585 B2
(45) Date of Patent: Jun. 14, 2011

(54) SEMICONDUCTOR DEVICE AND OPTICAL PICKUP DEVICE

(75) Inventors: Noriyuki Yoshikawa, Osaka (JP); Hiroyuki Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 310 days.

(21) Appl. No.: 12/331,625

(22) Filed: Dec. 10, 2008

(65) Prior Publication Data

US 2009/0154321 A1    Jun. 18, 2009

(30) Foreign Application Priority Data

Dec. 13, 2007    (JP) .................................. 2007-321445

(51) Int. Cl.
*H01S 5/022* (2006.01)
*G11B 7/00* (2006.01)
(52) U.S. Cl. ........................................ 369/122; 369/120
(58) Field of Classification Search ......................... None
See application file for complete search history.

(56) References Cited

U.S. PATENT DOCUMENTS

| 4,987,505 | A | * | 1/1991 | Iwabuchi et al. | ........... 360/246.2 |
|---|---|---|---|---|---|
| 6,373,124 | B1 | | 4/2002 | Kato et al. | ..................... 257/666 |
| 6,507,093 | B2 | | 1/2003 | Kaneda et al. | ................. 257/666 |
| 6,617,615 | B1 | * | 9/2003 | Ueda | .............................. 257/98 |
| 6,992,386 | B2 | | 1/2006 | Hata et al. | ..................... 257/735 |
| 7,843,044 | B2 | * | 11/2010 | Takahashi et al. | ............. 257/673 |
| 2002/0024000 | A1 | * | 2/2002 | Tsukamoto | ................ 250/203.1 |
| 2004/0159850 | A1 | * | 8/2004 | Takenaka | ......................... 257/98 |
| 2004/0240502 | A1 | * | 12/2004 | Yamamoto | ....................... 372/43 |
| 2009/0154321 | A1 | * | 6/2009 | Yoshikawa et al. | ........... 369/100 |

FOREIGN PATENT DOCUMENTS

| JP | 58-147141 | 9/1983 |
|---|---|---|
| JP | 61-102040 | 5/1986 |
| JP | 64-24449 | 1/1989 |
| JP | 2002-43674 | 2/2002 |

* cited by examiner

*Primary Examiner* — Peter Vincent Agustin
(74) *Attorney, Agent, or Firm* — Steptoe & Johnson LLP

(57) ABSTRACT

By increasing the width of a lead terminal 2 connected to a die pad 1 in the vicinity of the die pad 1 and forming a slit 9 and a projecting plate in the lead terminal in the region where resin 5 is formed, it is possible to ensure the holding strength of the lead terminal by the resin 5, as well as ensuring the strength of the lead terminal during the manufacturing process and achieving a reduction in thickness.

12 Claims, 7 Drawing Sheets

SEMICONDUCTOR DEVICE AND OPTICAL PICKUP DEVICE

BACKGROUND OF THE INVENTION

1. Field of the Invention

The present invention relates to a semiconductor device which is equipped with a semiconductor element, and to an optical pickup device which is equipped with the semiconductor device.

2. Description of the Related Art

Recently, in the field of optical disk devices which use semiconductor laser light, progress has been made in reducing thickness as devices are made more compact in size and lighter in weight. Therefore, semiconductor laser devices which are used as light sources in optical disk devices of this kind are also subject to urgent requirements for reduced thickness. In addition, there is the problem of the generation of heat due to an increase in the oscillating output of the semiconductor laser together with an increase in the writing and reading speed to and from an optical disk, and hence there is also a demand for good heat radiating properties. At the same time, there are also demands for increased strength in lead terminals in the manufacturing process for semiconductor laser devices.

Below, a conventional semiconductor laser device is described with reference to FIG. 6A, FIG. 6B, FIG. 7A and FIG. 7B.

FIG. 6A and FIG. 6B are diagrams showing the structure of the conventional semiconductor laser device in which the width of a lead terminal is increased; FIG. 6A is a plan diagram and FIG. 6B is a cross-sectional diagram taken along B-B in FIG. 6A.

In FIG. 6A and FIG. 6B, 1 is a die pad on which a semiconductor laser element is mounted; 29 is a lead terminal serving as an external terminal that is formed in an integral fashion with the die pad 1; 3 and 4 are lead terminals serving as external terminals that are formed without being connected to the die pad 1; 30 is resin of a frame structure which protects the semiconductor laser device, as well as insulating and fixing the respective lead terminals; and 6 is a base section which is formed in an integral fashion with the die pad. A lead frame is formed by the die pad 1, the lead terminal 29, the lead terminal 3, the lead terminal 4 and the base section 6. 7 is a cutting mark which is formed by cutting of a tie bar provided to ensure mechanical strength between the respective lead terminals when manufacturing the lead frame; the tie bar is cut at the very end of the manufacturing process of the lead frame. 17 is a semiconductor laser element, which is mounted on the die pad 1 via a sub mount 16. 18 is a wire which connects the respective lead terminals and the element 17. Here, the resin 30 is shown in a partially transparent fashion in order to clarify the shape of the lead terminals which are formed inside the same.

In the conventional semiconductor laser device shown in FIG. 6A and FIG. 6B, in order to ensure the strength of the lead terminals in the process for manufacturing a semiconductor laser device, an increased width section 10 is formed in which the lead width of the lead terminal 29 from the junction of the lead terminal 29 with the die pad 1 to the cutting mark 7 is formed to be thicker than the lead width of the other lead terminals.

FIG. 7A and FIG. 7B are cross-sectional diagrams showing the structure of a conventional thin semiconductor laser device; FIG. 7A is a plan diagram and FIG. 7B is a cross-sectional diagram taken along C-C in FIG. 7A. Furthermore, in FIG. 7A and FIG. 7B, the same reference numerals are assigned to compositional elements which are common to FIG. 6A and FIG. 6B, and further the description thereof is omitted here.

In the conventional semiconductor laser device shown in FIG. 7A and FIG. 7B, in order to achieve a thin width, the resin 30 provided on the rear surface with respect to the surface of the semiconductor laser device where the semiconductor laser element 17 is mounted is reduced in thickness. Even if the resin 30 provided on the rear surface is formed thinly, in order to ensure the holding strength of the lead terminal 29 and the adhesion of the resin 30, a bend section 8 is provided in the region of the lead terminal 29 which is covered with the resin 30 from the junction of the lead terminal 29 with the die pad 1, the die pad 1 including the base section 6 is formed into a shape which is cut down below the lead terminal 3, the lead terminal 4 and the bend section 8 of the lead terminal 29, and the resin 30 is provided below the region which includes the bend section 8, thereby making it possible to reduce the thickness of the resin 30 provided on the rear surface of the surface where the semiconductor laser element 17 is mounted. Moreover, it is also possible to completely remove the resin 30 which is provided on the rear surface portion of the surface where the semiconductor laser element 17 is mounted, and hence the rear surface of the semiconductor laser device can be made to coincide with the die pad 1. By this means, it is possible to form a semiconductor laser device into a thin dimension while maintaining a certain degree of holding strength for the lead terminals, and furthermore, by completely exposing the rear surface of the die pad 1, it is possible to improve the heat radiating effects by enlarging the contact surface area with a heat radiating plate.

However, there has been a problem in that if a composition is adopted which seeks to maintain the strength of the lead terminal and reduce the thickness of the semiconductor laser device by combining the characteristics of the two prior art semiconductor laser devices described above and increasing the lead width of the lead terminal 29 as well as providing the bend section 8 in the lead terminal 29, the amount of the resin 30 surrounding the lead terminal 29 is reduced in accordance with the increase in the lead width and hence the holding strength of the lead terminal 29 becomes insufficient. Conventionally, a composition has been considered for ensuring adhesiveness of the resin 30 by providing holes in the lead terminal which is covered with resin and causing the resin 30 to flow into these holes, but even in this case, generally the resin is formed so as to cover the whole surface of the semiconductor laser device, thereby ensuring the holding strength of the lead terminal, and in a composition where the resin 30 is not provided on the rear surface of the semiconductor laser device in this way, there have been problems in that the holding strength of the lead terminal cannot be ensured.

SUMMARY OF THE INVENTION

The present invention has been devised in order to solve the problems described above, an object thereof being to ensure the holding strength of a lead terminal by resin, while ensuring the strength of the lead terminal during a manufacturing process and achieving a reduction in thickness, in a semiconductor device or a lead frame to which resin is applied.

In order to achieve the aforementioned object, in a semiconductor device according to the present invention, a semiconductor element is mounted on a lead frame, and the lead frame comprises: a die pad on which the semiconductor element is mounted; a first lead terminal being an external terminal connected to the die pad; one or a plurality of second lead terminals being external terminals formed separately from the die pad; the first lead terminal being displaced from the die pad by means of a bend section and extending in a direction parallel to the surface of the die pad; resin of a frame structure formed so as to hold the first lead terminal and the second lead terminal while forming wall faces in at least three directions in a region for mounting the semiconductor element, including the portion of the first lead terminal and the second lead terminal adjacent to the die pad; and a connection section in which a slit is formed in the first lead terminal at least between the die pad and a neighborhood region including the bend section, and at least one portion of the connection section where the slit is formed is located in the region where the resin is formed and is filled with the resin.

Furthermore, the slit is formed plurally.

Furthermore, the slit is formed to project in the opposite direction to the direction of the die pad from the region where the resin is formed, and the resin is also formed inside the projecting slit.

Moreover, the slit is formed to project in the direction of the die pad from the region where the resin is formed, and the resin is also formed inside the projecting slit.

Furthermore, the respective widths of the portions of a lead constituting the first lead terminal remaining in the portion where the slit is formed are 0.7 to 1.2 times the thickness of the first lead terminal.

Moreover, the width of the slit is 0.7 to 1.2 times the thickness of the first lead terminal.

Moreover, a semiconductor element is mounted on a lead frame, and the lead frame comprises: a die pad on which the semiconductor element is mounted; a first lead terminal being an external terminal connected to the die pad; one or a plurality of second lead terminals being external terminals formed separately from the die pad; the first lead terminal being displaced from the die pad by means of a bend section and extending in a direction parallel to the surface of the die pad; resin of a frame structure formed so as to hold the first lead terminal and the second lead terminal while forming wall faces in at least three directions in a region for mounting the semiconductor element, including the portion of the first lead terminal and the second lead terminal adjacent to the die pad; and a projecting plate formed by cutting out from the first lead terminal in which the bend section is formed in the region where the resin is formed, in a state where the edge on the opposite side to the direction of the die pad is connected; and a slit formed by bending the projecting plate from the first lead terminal; and the projecting plate protrudes from the first lead terminal inside the resin, and the resin is also formed inside the slit.

Furthermore, the resin is formed so as to expose the rear surface with respect to the semiconductor element mounting surface.

Moreover, the lead width of the first lead terminal at least between the die pad and a neighborhood region including the bend section is greater than the lead width of the second lead terminal.

Furthermore, the respective widths of the portions of a lead constituting the first lead terminal remaining in the portion where the projecting plate is formed are 0.7 to 1.2 times the thickness of the first lead terminal.

Moreover, the width of the projecting plate is 0.7 to 1.2 times the thickness of the first lead terminal.

Furthermore, the semiconductor element is a light emitting element.

Furthermore, the semiconductor element is a light receiving element.

Moreover, both a light emitting element and a light receiving element are mounted as the semiconductor elements.

Furthermore, an optical pickup device according to the present invention is an optical pickup device for writing a signal to an optical disk or reading out a signal from an optical disk, by irradiating laser light onto the optical disk, comprising: a housing for holding the constituent components; the semiconductor device according to claim 9, held by the housing, for emitting the laser light; an object lens, held by the housing, for focusing the laser light on the optical disk; and a rising mirror, held by the housing, for bending light emitted from the semiconductor device in the direction of the optical disk.

DESCRIPTION OF THE PREFERRED EMBODIMENTS

Figure 1A:
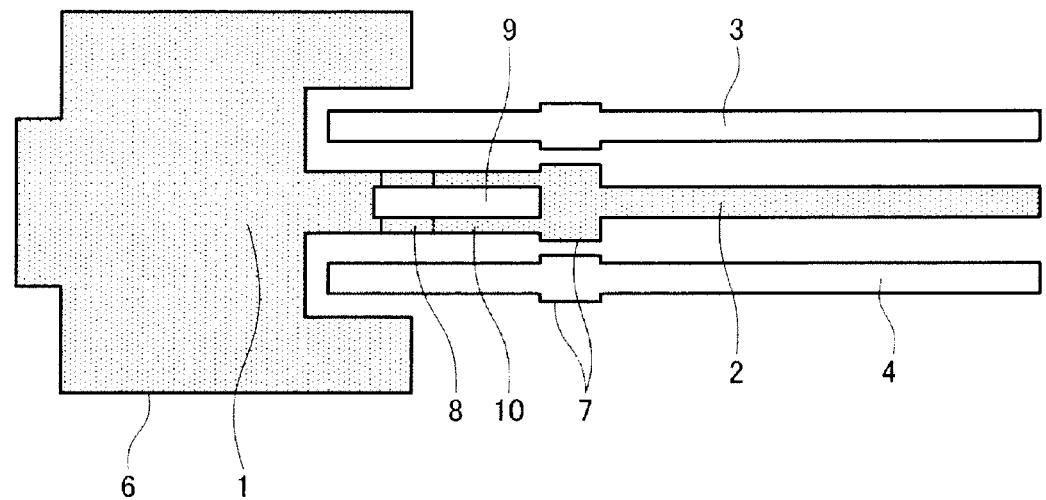
FIG. 1A is a diagram showing the composition of a lead frame according to a first embodiment.

Below, embodiments of the present invention will be described with reference to the drawings. Here, compositional elements which are common to drawings already described are labeled with the same reference numerals, and further the explanation thereof is omitted here. Furthermore, a semiconductor laser device which is equipped with a semiconductor laser element or a lead frame used in the same is described as an example.

First Embodiment

To start with, a first embodiment is described in detail with reference to FIG. 1A, FIG. 1B and FIG. 1C.

Figure 1B:
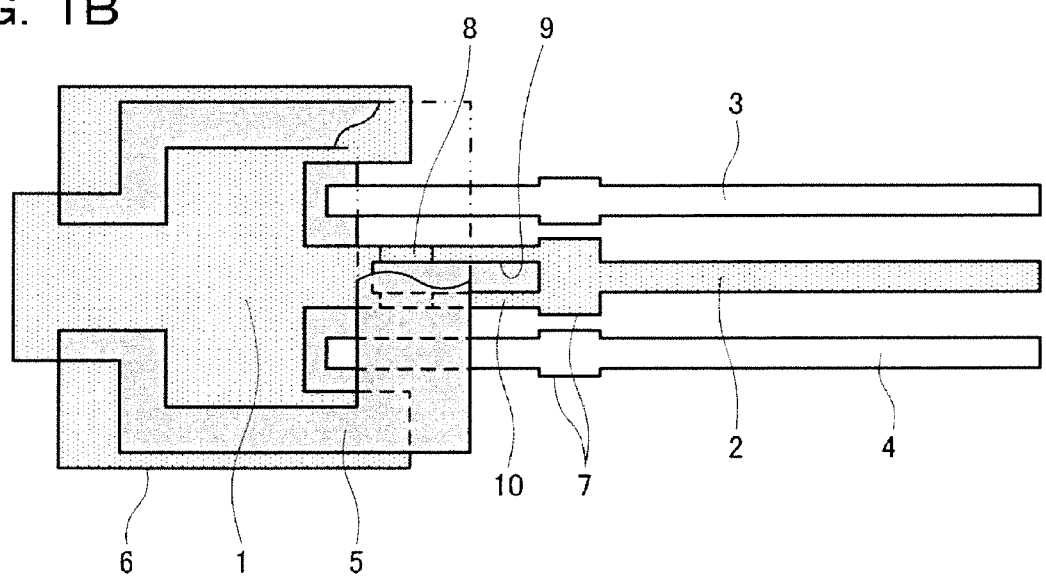
FIG. 1B is a diagram showing the composition of the lead frame according to the first embodiment.
Figure 1C:
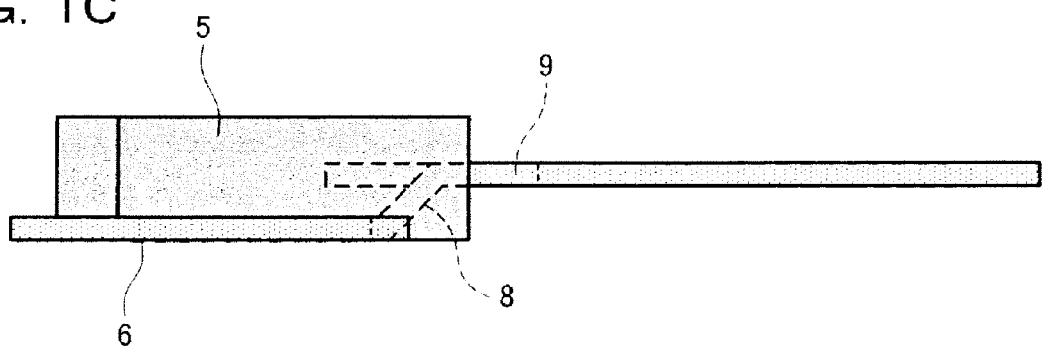
FIG. 1C is a diagram showing the composition of the lead frame according to the first embodiment.

FIG. 1A, FIG. 1B and FIG. 1C are diagrams showing the composition of a lead frame according to the first embodiment; FIG. 1A is a plan diagram of the lead frame; FIG. 1B is a plan diagram of a state where resin has been formed; and FIG. 1C is a side diagram of FIG. 1B.

In FIG. 1A, FIG. 1B and FIG. 1C, 1 is a die pad on which a semiconductor laser element is mounted, 2 is a lead terminal which is an external terminal formed in an integral fashion with the die pad 1; 3 and 4 are lead terminals which are external terminals formed without being connected to the die pad 1; 5 is resin of a frame structure which protects a semiconductor laser device, as well as insulating and fixing the respective lead terminals, and the resin is formed so as to protect the semiconductor chip mounting region of the die pad 1 and to have an opening in the wire connection region of the respective lead terminals which holds the respective lead terminals. 6 is a base section which is formed integrally with the die pad and serves to register positions during the installation step and to radiate the heat generated by the semiconductor laser element mounted on the die pad. A lead frame as shown in FIG. 1A is formed by the die pad 1, the lead terminal 2, the lead terminal 3, the lead terminal 4 and the base section 6. Furthermore, cutting marks 7 are left remaining on the lead terminal 2, the lead terminal 3 and the lead terminal 4, these marks having been created when a tie bar which is provided in order to ensure mechanical strength between the respective lead terminals during the manufacture of the lead frame is cut at the very end of the manufacturing process of the lead frame. Moreover, an increased width section 10 in which the lead width is increased in order to enhance the mechanical strength is provided from the junction of the lead terminal 2 with the die pad 1 until the cutting mark 7. Here, the resin 5 is shown in a partially transparent fashion in order to clarify the shape of the lead terminals which are formed inside the same.

In the lead frame to which resin has been applied shown in FIG. 1A, FIG. 1B and FIG. 1C, the resin 5 provided on the rear surface with respect to the mounting surface of the semiconductor laser element is formed thinly in order to achieve a reduction in the thickness of the lead frame. By providing a bend section 8 in the region of the lead terminal 2 covered with the resin 5 from the junction of the die pad 1, forming the die pad 1 including the base section 6 in a shape which descends from the cutting marks 7 of the lead terminal 3, the lead terminal 4 and the lead terminal 2, and also providing the resin 5 in the portion below the region of the bend section 8, it is possible to reduce the thickness of the resin 5 which is provided on the rear surface. Furthermore, the resin 5 which is also provided below the region of the bend section 8 forms a single face with the rear surface of the die pad 1, and hence the contact surface area between the die pad 1 and a heat radiating plate can be broadened and the heat radiating efficiency can be improved (the state shown in FIG. 1C). Moreover, in the lead frame according to the present embodiment, by providing a slit 9 in the region of the lead terminal 2 which is covered with the resin 5, and by providing the resin 5 inside the slit 9 as well, the holding strength of the lead terminal 2 and the adhesion of the resin 5 are guaranteed. In this case, the slit 9 is formed so as to project out beyond the resin 5 either in the direction of the cutting mark 7 or the direction of the die pad 1, or in both directions, and hence a large contact surface area is created between the resin 5 and the lead terminal 2 by filling the projecting slit 9 with the resin 5, which makes it possible to improve the holding strength of the lead terminal 2 and the adhesion of the resin 5. Providing the increased width section 10 in order to improve the mechanical strength of the lead terminal 2 is especially effective in cases where the holding strength of the lead terminal 2 is insufficient, or the like.

In a lead frame where an increased width section 10 is provided in order to improve the mechanical strength of the lead terminal 2 and furthermore resin 5 is not formed on the rear surface of the die pad 1 in order to reduce the thickness and enhance heat radiating properties, then by providing a slit 9 in the lead terminal 2 and causing resin 5 to flow inside the slit 9, it is possible to ensure the holding strength of the lead terminal 2 and the adhesion of the resin 5, while achieving a thin dimension for the lead frame including the resin 5. Furthermore, since the rear surface of the die pad 1 is completely exposed, then it is also possible to improve the heat radiating effects by broadening the contact surface area with the heat radiating plate.

The respective widths of the portions of the lead terminal which remain on either side of the slit 9 are preferably equal to or more than 0.7 times the thickness of the lead terminal due to the manufacturing limits of the lead frame, and preferably equal to or less than 1.2 times the thickness of the lead terminal due to the dimensional restrictions of the leads. Similarly, it is preferable that the width of the slit 9 should be equal to or more than 0.7 times and equal to or less than 1.2 times the thickness of the lead terminals.

Second Embodiment

Next, a second embodiment is described in detail with reference to FIG. 2A, FIG. 2B and FIG. 2C.

Figure 2A:
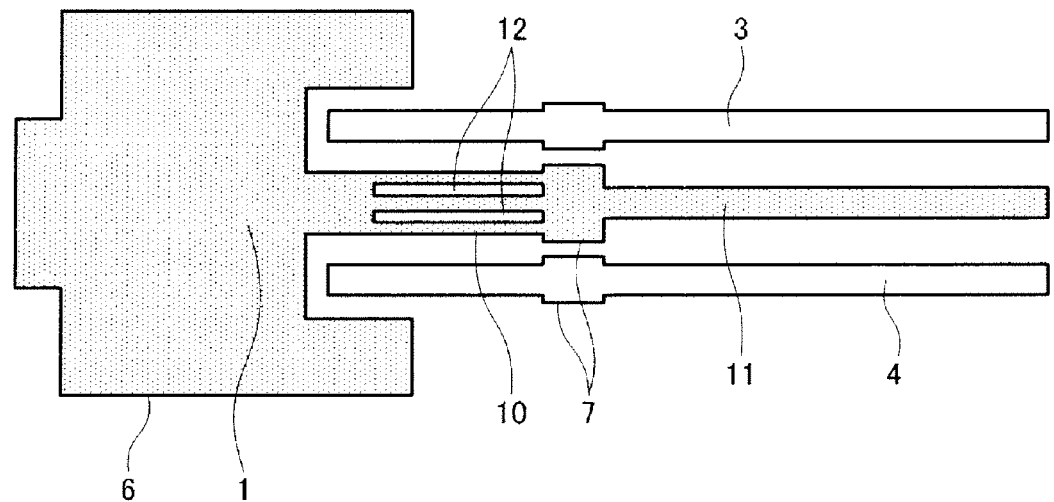
FIG. 2A is a diagram showing the composition of a lead frame according to a second embodiment.
Figure 2B:
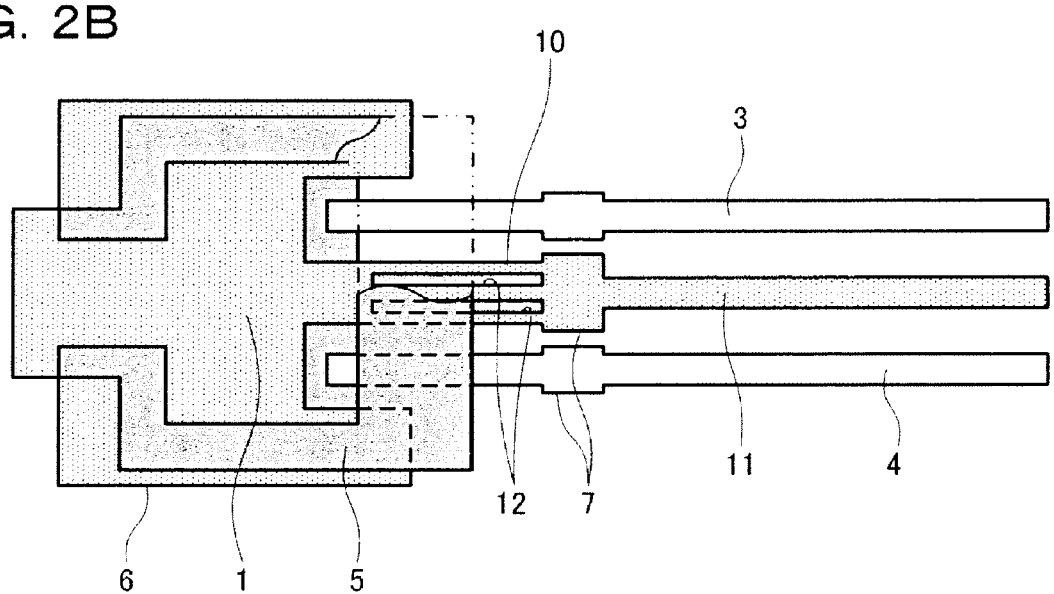
FIG. 2B is a diagram showing the composition of the lead frame according to the second embodiment.
Figure 2C:
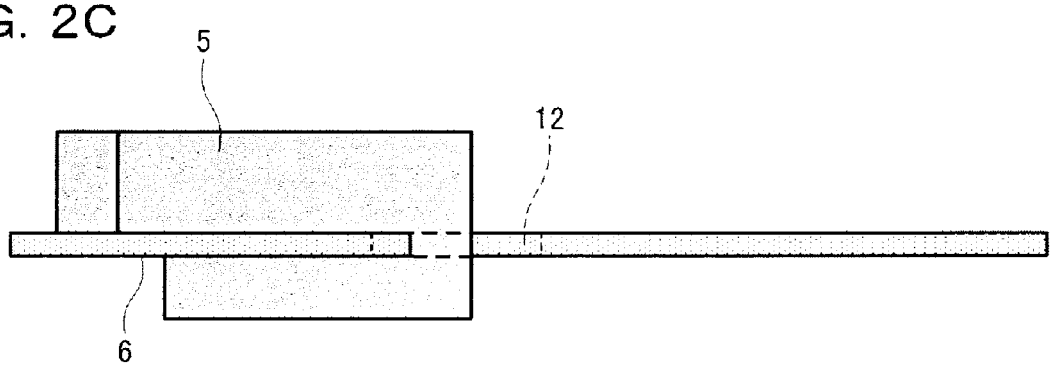
FIG. 2C is a diagram showing the composition of the lead frame according to the second embodiment.

FIG. 2A, FIG. 2B and FIG. 2C are diagrams showing the composition of a lead frame according to the second embodiment; FIG. 2A is a plan diagram of the lead frame; FIG. 2B is a plan diagram of a state where resin has been formed; and FIG. 2C is a side diagram of FIG. 2B.

In FIG. 2A, FIG. 2B and FIG. 2C, 1 is a die pad on which a semiconductor laser element is mounted, 11 is a lead terminal which is an external terminal formed in an integral fashion with the die pad 1; 3 and 4 are lead terminals which are external terminals formed without being connected to the die pad 1; 5 is resin of a frame structure which protects a semiconductor laser device, as well as insulating and fixing the respective lead terminals, and the resin is formed so as to protect the semiconductor chip mounting region of the die pad 1 and to have an opening in the wire connection region of the respective lead terminals which holds the respective lead terminals. 6 is a base section which is formed integrally with the die pad and serves to register positions during the installation step and to radiate the heat generated by the semiconductor laser element mounted on the die pad. A lead frame as shown in FIG. 2A is formed by the die pad 1, the lead terminal 11, the lead terminal 3, the lead terminal 4 and the base section 6. Furthermore, cutting marks 7 are left remaining on the lead terminal 11, the lead terminal 3 and the lead terminal 4, these marks having been created when a tie bar which is provided in order to ensure mechanical strength between the respective lead terminals during the manufacture of the lead frame is cut at the very end of the manufacturing process of the lead frame. Moreover, an increased width section 10 in which the lead width is increased in order to enhance the mechanical strength is provided from the junction of the lead terminal 11 with the die pad 1 until the cutting mark 7. Here, the resin 5 is shown in a partially transparent fashion in order to clarify the shape of the lead terminals which are formed inside the same.

Moreover, in the lead frame to which resin is attached shown in FIG. 2A, FIG. 2B and FIG. 2C, by providing a plurality of slits 12 in the region of the lead terminal 11 which is covered with the resin 5, and by providing the resin 5 inside the slits 12 as well, the holding strength of the lead terminal 11 and the adhesion of the resin 5 are guaranteed. In this case, by forming the slits 12 so as to project beyond the resin 5 in the direction of the cutting mark 7 or the direction of the die pad 1, or in both of these directions, and causing the resin 5 to flow into the projecting slits 12 also, it is possible to further improve the holding strength of the lead terminal 11 and the adhesion of the resin 5.

As described above, in the lead frame in which the increased width section 10 is provided in order to improve the mechanical strength of the lead terminal 11 and furthermore the amount of resin 5 is reduced in order to achieve a thin dimension, by providing the plurality of slits 12 in the lead terminal 11 and causing the resin 5 to flow into the slits 12, it is possible to improve the mechanical strength of the lead terminal 11 and to improve the holding strength of the lead terminal 11 and the adhesion of the resin 5, while achieving a thin dimension for the lead frame including the resin 5.

The respective widths of the portions of the lead terminal which remain on either side of the respective slits 12 are preferably equal to or more than 0.7 times the thickness of the lead terminal due to the manufacturing limits of the lead frame, and preferably equal to or less than 1.2 times the thickness of the lead terminal due to the dimensional restrictions of the leads. Similarly, it is preferable that the width of the slit 12 should be equal to or more than 0.7 times and equal to or less than 1.2 times the thickness of the lead terminals.

Furthermore, in the present embodiment, a composition was described in which no bend section is provided in the lead terminal 11 and the resin 5 is formed on the rear surface of the die pad 1, but similarly to the first embodiment, it can also be applied to a lead frame to which resin has been applied in which a bend section is provided in the lead terminal 11 and the resin below the lead terminal is made to form a single face with the rear surface of the die pad 1.

Third Embodiment

Next, a third embodiment is described in detail with reference to FIG. 3A, FIG. 3B and FIG. 3C.

Figure 3A:
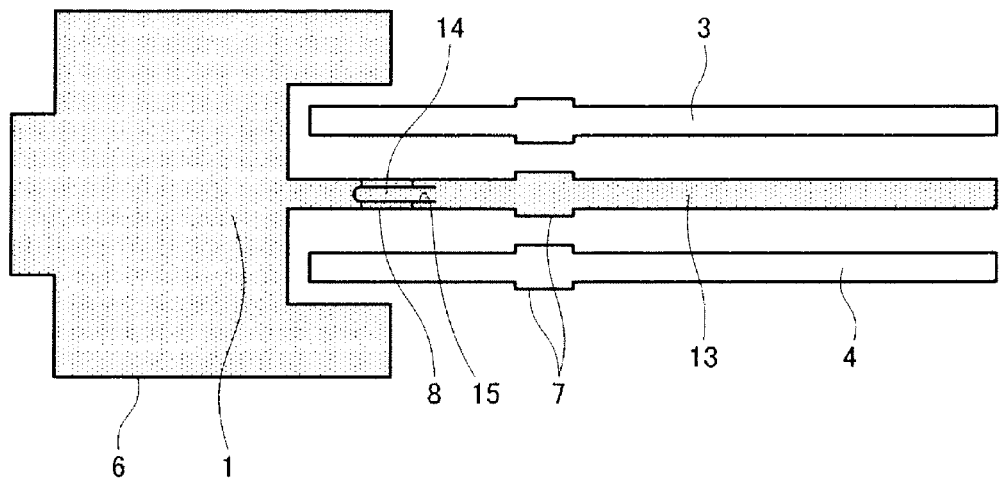
FIG. 3A is a diagram showing the composition of a lead frame according to a third embodiment.
Figure 3B:
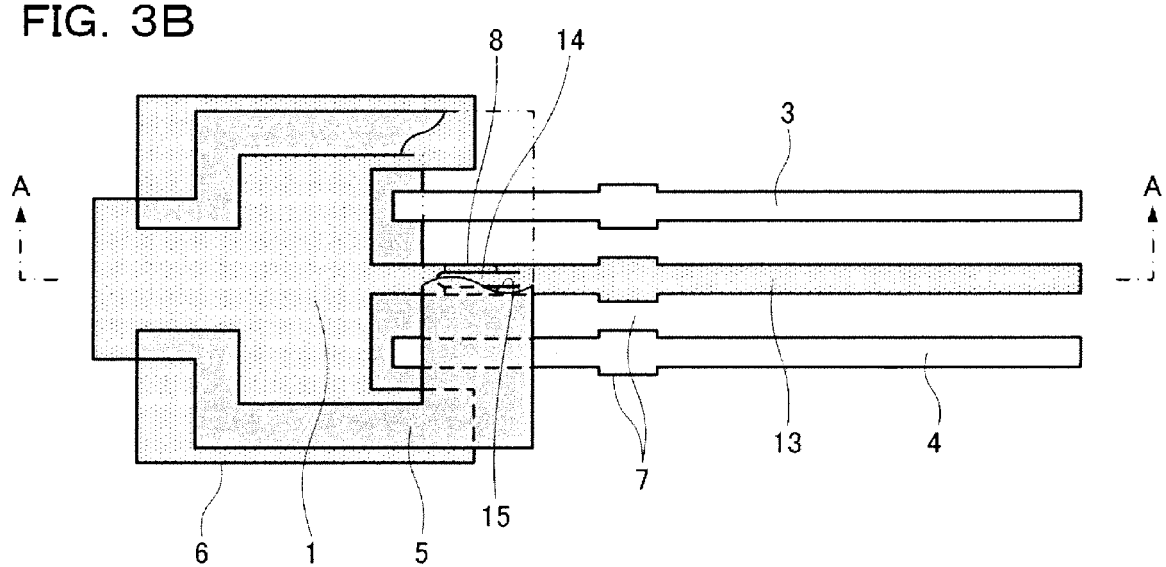
FIG. 3B is a diagram showing the composition of the lead frame according to the third embodiment.
Figure 3C:
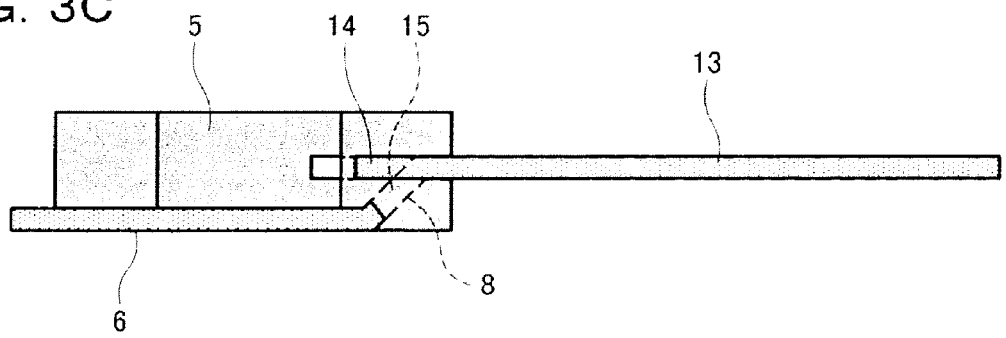
FIG. 3C is a diagram showing the composition of the lead frame according to the third embodiment.

FIG. 3A, FIG. 3B and FIG. 3C are diagrams showing the composition of a lead frame according to the third embodiment; FIG. 3A is a plan diagram of the lead frame; FIG. 3B is a plan diagram of a state where resin has been formed; and FIG. 3C is a cross-sectional diagram taken along A-A in FIG. 3B.

In FIG. 3A, FIG. 3B and FIG. 3C, 1 is a die pad on which a semiconductor laser element is mounted, 13 is a lead terminal which is an external terminal formed in an integral fashion with the die pad 1; 3 and 4 are lead terminals which are external terminals formed without being connected to the die pad 1; 5 is resin of a frame structure which protects a semiconductor laser device, as well as insulating and fixing the respective lead terminals, and the resin is formed so as to protect the semiconductor chip mounting region of the die pad 1 and to have an opening in the wire connection region of the respective lead terminals which holds the respective lead terminals. 6 is a base section which is formed integrally with the die pad and serves to register positions during the installation step and to radiate the heat generated by the semiconductor laser element mounted on the die pad. A lead frame as shown in FIG. 3A is formed by the die pad 1, the lead terminal 13, the lead terminal 3, the lead terminal 4 and the base section 6. Furthermore, cutting marks 7 are left remaining on the lead terminal 13, the lead terminal 3 and the lead terminal 4, these marks having been created when a tie bar which is provided in order to ensure mechanical strength between the respective lead terminals during the manufacture of the lead frame is cut at the very end of the manufacturing process of the lead frame. Furthermore, by providing a bend section 8 in the region of the lead terminal 13 covered with the resin 5 from the junction of the die pad 1, forming the die pad 1 including the base section 6 in a shape which descends from the cutting marks 7 of the lead terminal 3, the lead terminal 4 and the lead terminal 13, and also providing the resin 5 in the portion below the region of the bend section 8, it is possible to reduce the thickness of the resin 5 which is provided on the rear surface. Furthermore, the resin 5 which is also provided below the region of the bend section 8 forms a single face with the rear surface of the die pad 1, and hence the contact surface area between the die pad 1 and a heat radiating plate can be broadened and the heat radiating efficiency can be improved (the state shown in FIG. 3C). Here, the resin 5 is shown in a partially transparent fashion in order to clarify the shape of the lead terminals which are formed inside the same.

In the lead frame to which resin is attached shown in FIG. 3A, FIG. 3B and FIG. 3C, a projecting plate 14 is provided in the region of the lead terminal 13 that is covered with the resin 5. The projecting plate 14 is formed by inserting cuts following the shape of the projecting plate 14 in the region of the lead terminal 13 which is covered with the resin 5, while leaving the edge of the projecting plate 14 close to the cutting mark 7 in a connected state, and then bending the portion where the cuts have been inserted so as to be parallel to or nearly parallel to the die pad 1, the lead terminal 13 being left with a slit 15 in the portion where the projecting plate 14 was present. In the lead frame having this composition, by providing the resin 5 inside the slit 15 and providing the projecting plate 14 which is connected to the lead terminal 13 inside the resin 5, it is possible to improve the holding strength of the lead terminal 13 and the adhesion of the resin 5.

As described above, in the lead frame where resin 5 is not formed on the rear surface of the die pad 1 in order to reduce the thickness and to improve heat radiating properties, by providing the projecting plate 14 and the slit 15 in the lead terminal 13, causing the resin 5 to flow into the slit 15 and forming the projecting plate 14 which is connected to the lead terminal 13 inside the resin 5, then it is possible to ensure the holding strength of the lead terminal 13 and the adhesion of the resin 5 while achieving a thin dimension for the lead frame including the resin 5. Furthermore, since the rear surface of the die pad 1 is completely exposed, then it is also possible to improve the heat radiating effects by broadening the contact surface area with the heat radiating plate.

The respective widths of the portions of the lead terminal which remain on either side of the slit 14 and the widths of the projecting plate 14 and the slit 15 are preferably equal to or more than 0.7 times the thickness of the lead terminal due to the manufacturing limits of the lead frame, and preferably equal to or less than 1.2 times the thickness of the lead terminal due to the dimensional restrictions of the leads.

Furthermore, similarly to the first embodiment and the second embodiment, it is also possible to provide an increased width section 10 in which the lead width becomes greater from the junction of the lead terminal 13 with the die pad 1 until the cutting mark 7. By providing an increased width section 10, it is also possible to increase the mechanical strength of the lead terminal 13.

Furthermore, in the respective embodiments described above, a composition was described in which there are two lead terminals that are not connected to the die pad, but it is also possible to provide one lead terminal that is not connected to the die pad, or conversely, three or more lead terminals.

In the description given above, a lead frame which is left with cutting marks was described as an example, but if it is possible to cut the die pad without leaving cutting marks, then there is absolutely no need to leave cutting marks. In this case, it is possible to form the end of the slit at any length in a range which allows the resin to flow out, for example, in the vicinity of the bend section.

Fourth Embodiment

Next, a semiconductor device according to a fourth embodiment will be described in detail with reference to FIG. 4.

Figure 4:
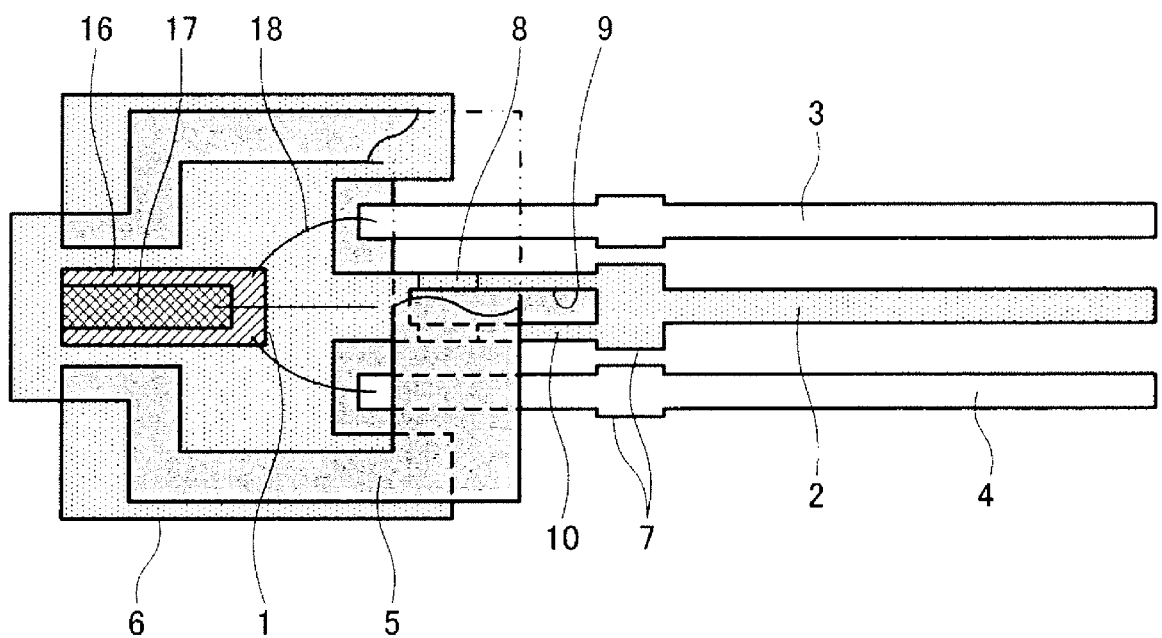
FIG. 4 is a plan diagram showing the composition of a semiconductor laser device according to a fourth embodiment.

FIG. 4 is a plan diagram showing the composition of a semiconductor laser device according to the fourth embodiment.

In the semiconductor laser device shown in FIG. 4, a semiconductor laser element 17 is mounted via a sub mount 16 on the die pad 1 of the lead frame to which resin has been applied which was described in the first embodiment. The semiconductor laser element 17 and the lead terminal 2 are directly connected electrically, and a wire 18 which electrically connects the semiconductor laser element 17, the lead terminal 3 and the lead terminal 4 via the sub mount 16 is bonded. Moreover, in order to seal the region surrounded by resin 5 where the semiconductor laser element 17 is mounted, a cap (not illustrated) provided with a laser transmission region is installed according to requirements.

As described above, by mounting the semiconductor laser element as a semiconductor laser device on the lead frame to which resin has been applied according to the first embodiment, it is possible to ensure the holding strength of the lead terminal 2 and the adhesion of the resin 5 while achieving a thin dimension of the semiconductor laser device.

Here, the semiconductor laser device which uses the lead frame to which resin has been applied according to the first embodiment was described as an example, but it is also possible to form a semiconductor laser device having a similar composition by using the lead frame to which resin has been applied according to the second embodiment or the third embodiment.

Moreover, here, an example was described in which the semiconductor laser element which is a light-emitting element was taken as a semiconductor element which is mounted on the lead frame to which resin has been applied, but by installing a light receiving element, a resistance element or another circuit element individually or in combination with each other, it is possible to ensure the strength of the lead terminals in the manufacturing process, and it is also possible to form semiconductor devices of various types which can ensure the holding strength of the lead terminals by means of the resin while achieving a thin dimension. Since the heat radiating efficiency can be improved by broadening the contact surface area between the die pad and the heat radiating plate, then particularly beneficial effects are obtained when an element which generates heat is mounted. Moreover, by providing an increased width section in the lead terminal, the dimensional accuracy of the package is maintained, and therefore beneficial effects are obtained in applications which require high precision in the mounting position, such as light emitting elements.

Fifth Embodiment

Next, an optical pickup device according to a fifth embodiment will be described in detail with reference to FIG. 5.

Figure 5:
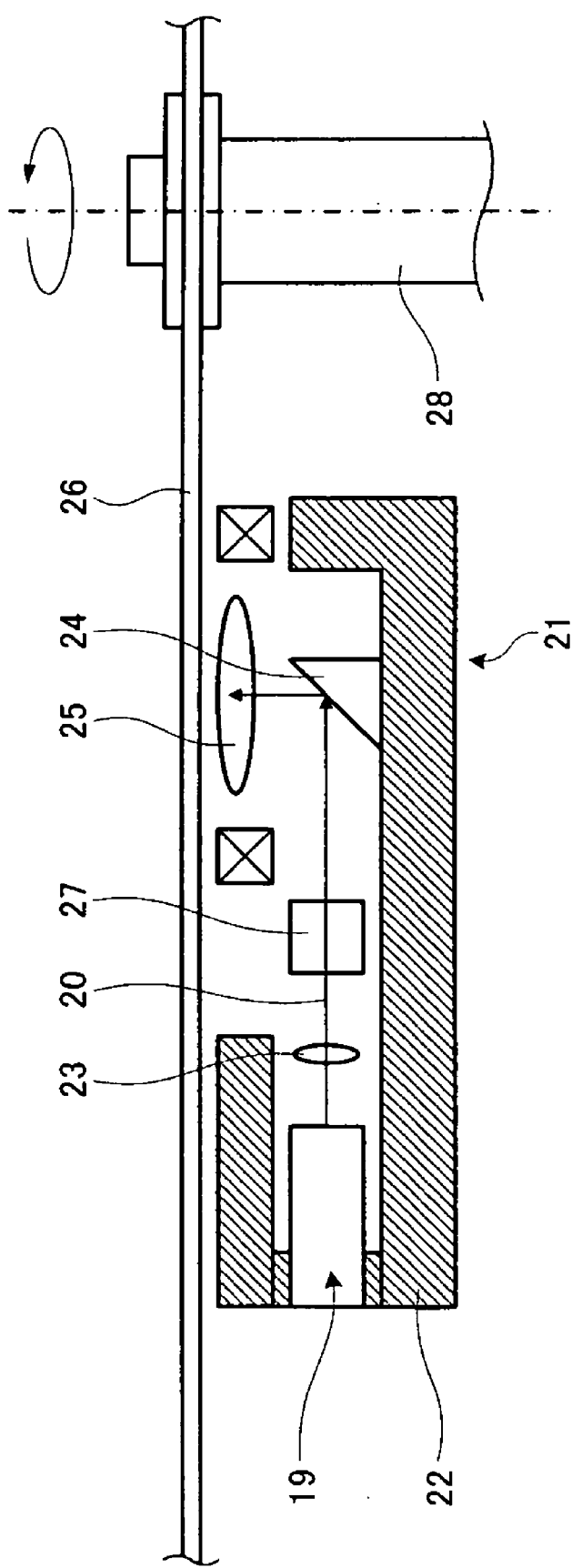
FIG. 5 is a diagram showing the composition of an optical pickup device according to a fifth embodiment.
Figure 6A:
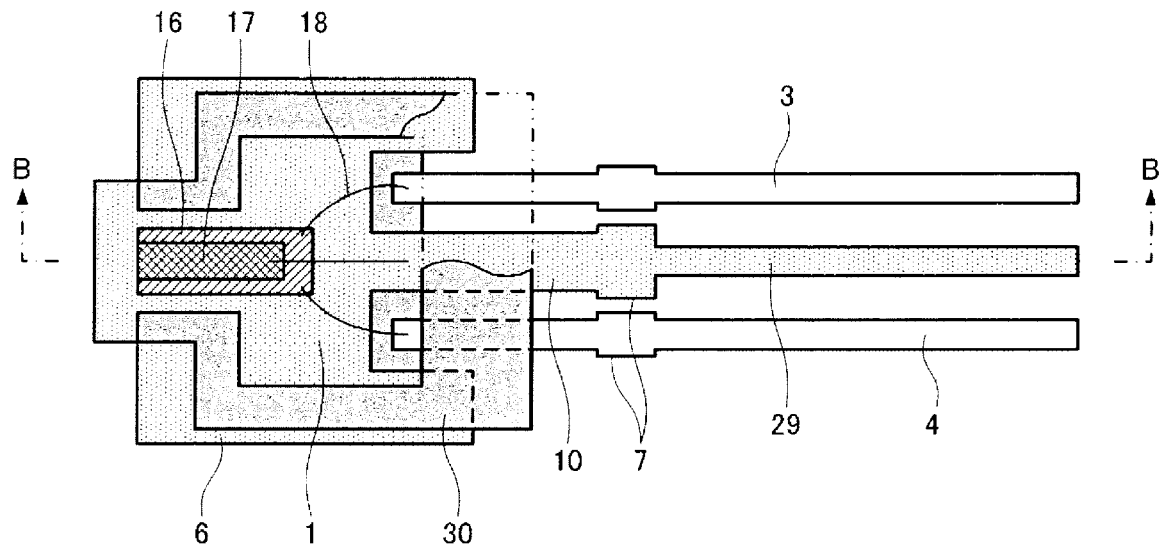
FIG. 6A is a diagram showing the structure of a conventional semiconductor laser device in which the width of a lead terminal is increased.
Figure 6B:
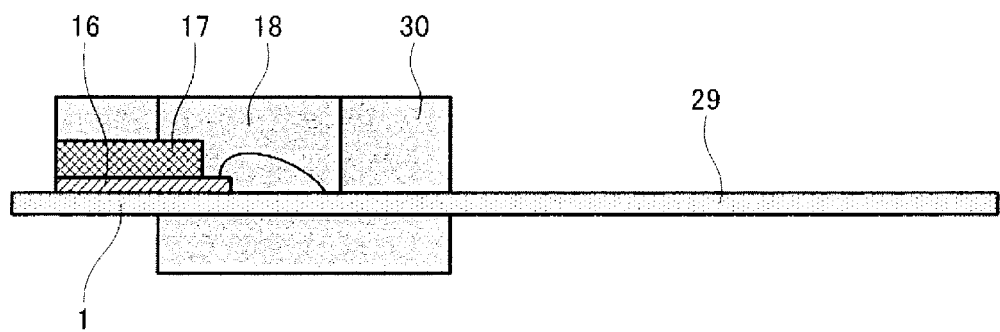
FIG. 6B is a diagram showing the structure of the conventional semiconductor laser device in which the width of the lead terminal is increased.
Figure 7A:
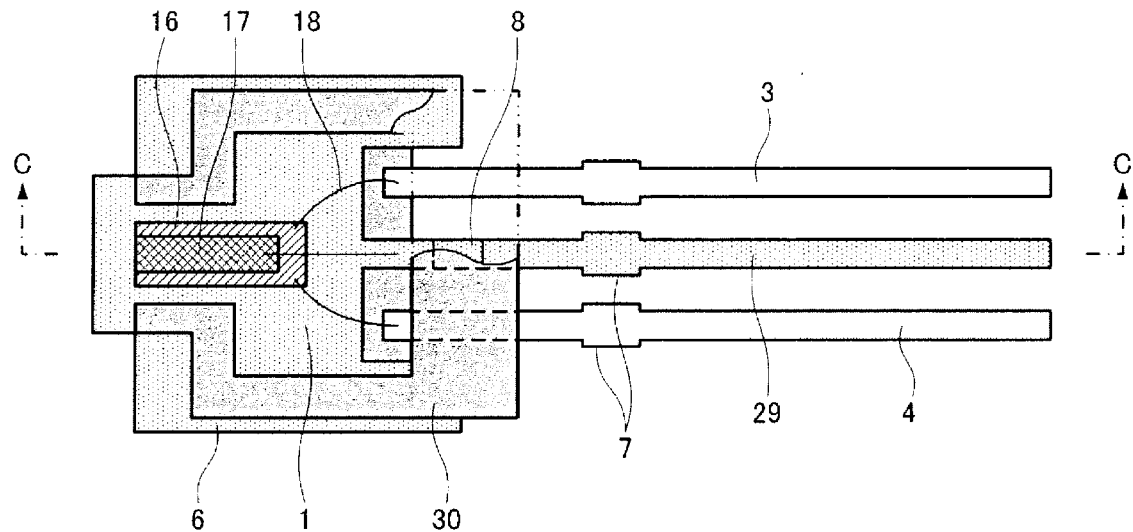
FIG. 7A is a cross-sectional diagram showing the structure of a conventional thin semiconductor laser device.
Figure 7B:
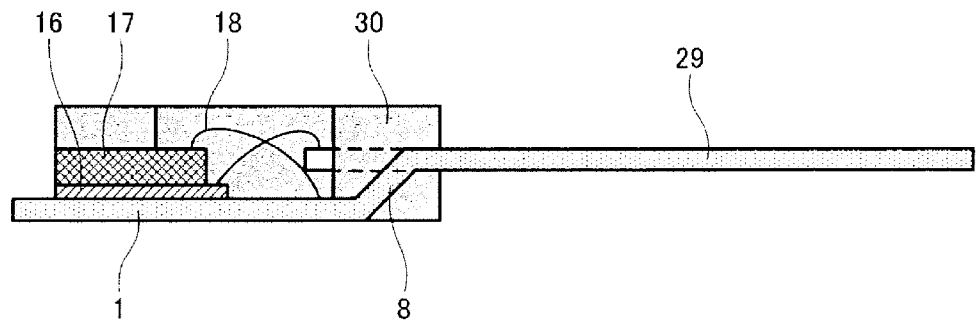
FIG. 7B is a cross-sectional diagram showing the structure of the conventional thin semiconductor laser device.

FIG. 5 is a diagram showing the composition of the optical pickup device according to the fifth embodiment.

As shown in FIG. 5, the optical pickup device 21 has a housing 22 which supports an optical component, and the semiconductor laser device 19 according to the fourth embodiment is mounted on the optical pickup device as an optical device. Laser light 20 emitted from the semiconductor laser device 19 is collimated into parallel light by a collimating lens 23, the light path is bent through 90° by a rising mirror 24, and the light is then focused on pits recorded on an optical disk 26 by an object lens 25. The laser light 20 which has read in the signal on the pits is reflected by the optical disk 26, returns in the reverse direction along the same path, is split by a beam splitter 27, and is input to a light receiving element (not illustrated), which reads in the signal recorded on the optical disk. The optical pickup device 21 according to the fifth embodiment is constituted by the semiconductor laser device 19, the housing 22, the collimating lens 23, the rising mirror 24, the object lens 25 and the beam splitter 27 described above. A rotating shaft 28 of the optical disk 26 is caused to rotate by turning a spindle motor.

As described above, by using a semiconductor laser device which ensures the holding strength of a lead terminal by means of resin, while ensuring the strength of the lead terminal during the manufacturing process and achieving a reduction in thickness, it is possible to install the laser device easily in an optical pickup device.

What is claimed is:

1. A semiconductor device, in which a semiconductor element is mounted on a lead frame,
wherein the lead frame comprises:
a die pad on which the semiconductor element is mounted;
a first lead terminal being an external terminal connected to the die pad;
one or a plurality of second lead terminals being external terminals formed separately from the die pad;
the first lead terminal being displaced from the die pad by means of a bend section and extending in a direction parallel to a surface of the die pad;
resin of a frame structure formed so as to hold the first lead terminal and the second lead terminal while forming wall faces in at least three directions in a region for mounting the semiconductor element, including a portion of the first lead terminal and the second lead terminal adjacent to the die pad; and
a connection section in which a slit is formed in the first lead terminal at least between the die pad and a neighborhood region including the bend section, and
wherein at least one portion of the connection section where the slit is formed is located in a region where the resin is formed and is filled with the resin.

2. The semiconductor device according to claim 1, wherein the resin is formed so as to expose a rear surface with respect to a surface where the semiconductor element is mounted.

3. The semiconductor device according to claim 1, wherein the slit is formed plurally.

4. The semiconductor device according to claim 1, wherein the slit is formed to project in an opposite direction to a direction of the die pad from the region where the resin is formed, and the resin is also formed inside the projecting slit.

5. The semiconductor device according to claim 1, wherein the slit is formed to project in a direction of the die pad from the region where the resin is formed, and the resin is also formed inside the projecting slit.

6. The semiconductor device according to claim 1, wherein a lead width of the first lead terminal at least between the die pad and the neighborhood region including the bend section is greater than a lead width of the second lead terminal.

7. The semiconductor device according to claim 1, wherein respective widths of portions of a lead constituting the first lead terminal remaining in a portion where the slit is formed are 0.7 to 1.2 times a thickness of the first lead terminal.

8. The semiconductor device according to claim 1, wherein a width of the slit is 0.7 to 1.2 times a thickness of the first lead terminal.

9. The semiconductor device according to claim 1, wherein the semiconductor element is a light emitting element.

10. The semiconductor device according to claim 1, wherein the semiconductor element is a light receiving element.

11. The semiconductor device according to claim 1, wherein both a light emitting element and a light receiving element are mounted as the semiconductor elements.

12. An optical pickup device for writing a signal to an optical disk or reading out a signal from an optical disk, by irradiating laser light onto the optical disk, comprising:
 a housing for holding constituent components;
 the semiconductor device according to claim 9, held by the housing, for emitting the laser light;
 an object lens, held by the housing, for focusing the laser light on the optical disk; and
 a rising mirror, held by the housing, for bending light emitted from the semiconductor device in a direction of the optical disk.

* * * * *